United States Patent [19]
Giannatto et al.

[11] Patent Number: 6,026,565
[45] Date of Patent: Feb. 22, 2000

[54] HOUSING FOR DIVERSE COOLING CONFIGURATION PRINTED CIRCUIT CARDS

[75] Inventors: Carl J. Giannatto, Melbourne; Kevin C. Cornish, Palm Bay, both of Fla.

[73] Assignee: Harris Corporation, Melbourne, Fla.

[21] Appl. No.: 09/176,245

[22] Filed: Oct. 21, 1998

Related U.S. Application Data

[60] Division of application No. 08/916,831, Aug. 22, 1997, Pat. No. 5,982,619, which is a continuation-in-part of application No. 08/873,677, Jun. 12, 1997, Pat. No. 5,835,349.

[51] Int. Cl.[7] .................................................. H05K 3/36
[52] U.S. Cl. ...................... 29/830; 361/701; 165/104.33; 165/80.3; 165/80.1
[58] Field of Search .............................. 29/830, 831, 832, 29/840; 361/695–6, 701–4, 718; 174/385; 165/803, 104.33

[56] References Cited

U.S. PATENT DOCUMENTS

| | | | |
|---|---|---|---|
| 5,276,584 | 1/1994 | Collins et al. ........................ | 361/718 |
| 5,414,592 | 5/1995 | Stout et al. .......................... | 361/704 |
| 5,440,450 | 8/1995 | Lau et al. ............................ | 361/695 |
| 5,457,342 | 10/1995 | Herbst, II .......................... | 257/712 |
| 5,467,251 | 11/1995 | Katchmar ............................ | 361/719 |
| 5,473,508 | 12/1995 | Porter et al. ........................ | 361/695 |
| 5,473,511 | 12/1995 | Reddy et al. ........................ | 361/719 |

*Primary Examiner*—Lee Young
*Assistant Examiner*—Sean Smith
*Attorney, Agent, or Firm*—Charles E. Wands

[57] ABSTRACT

A printed circuit card housing provides separate cooling fluid travel paths for convectively cooling on-board heat exchangers of non mil. spec. component-retaining printed circuit cards, and for thermal conductive cooling of conventional (VME) circuit cards, while keeping both types of circuit cards sealed from contaminants that may be present in the cooling fluid. The housing includes a chassis having a card slot cavity, into which both types of printed circuit cards are retained. A cooling fluid supply/exhaust plenum provides a first cooling fluid travel path that is ported to only convectively cooled circuit cards. In order to cool the remaining circuit cards, the cooling fluid supply/exhaust plenum ports cooling fluid entering the plenum along a second cooling fluid travel path through heat exchangers installed along sidewalls of the chassis.

14 Claims, 5 Drawing Sheets

6,026,565

HOUSING FOR DIVERSE COOLING CONFIGURATION PRINTED CIRCUIT CARDS

CROSS-REFERENCE TO RELATED APPLICATIONS

The present application is a divisional of Ser. No. 08/916,831, filed Aug. 22, 1997 now U.S. Pat. No. 5,982,619, which is a continuation-in-part of application, Ser. No. 08/873,677, filed Jun. 12, 1997, now U.S. Pat. No. 5,835,349, entitled: "Printed Circuit Board-Mounted, Sealed Heat Exchanger," by C. Giannatto et al (hereinafter referred to as the '677 application), assigned to the assignee of the present application and the disclosure of which is herein incorporated.

FIELD OF THE INVENTION

The present invention relates in general to a housing and cooling enclosure for securely retaining and cooling a multiple types of printed circuit cards. In particular, the housing and cooling enclosure of the invention provides parallel circulation paths for a cooling fluid through cooling fluid flow chambers of on-board heat exchangers of convectively cooled printed circuit cards, and through thermally conductive heat exchangers along sidewalls of a chassis for thermally conductively cooled printed circuit cards.

BACKGROUND OF THE INVENTION

As described in the above-referenced '677 application, a variety of communication systems, particularly those installed in mobile (e.g., land-based) platforms, are designed to be environmentally robust in terms of their hardware and signaling format. As a non-limiting example, for the case of a vehicle-mounted, communication system intended for use with a plurality of UHF line-of-sight and satellite links, a multi-link transceiver mounting rack may contain a plurality of diverse pieces of communication equipment, that typically include RF transmitter modules, RF receiver modules, and various digital signal processing modules, which control the operation of the RF components, and interface digital communications signals with attendant encryption and decryption processing circuits. Since each communication link has its own dedicated signalling scheme (modulation format, link protocol, band occupancy assignment, etc.), suppliers of such equipment will typically provide each system as an integrated unit.

One of the standard bus architectures employed for such systems is the VME bus, which is comprised of a pair of multiple lead bus links. One of these bus links has a predefined set of bus connection definitions, to which each module that may be plugged into the VME bus must conform. On the other hand, other than limited power rail assignments, the second bus link has unspecified bus connection definitions, allowing the user to customize the second bus link, or connector interconnects to that bus link, as desired.

Typically, RF signaling circuits and digital signaling modules plug into their own connector slots on the VME bus, in order to provide noise/cross-talk isolation between the RF and digital signal processing components of a given communication system architecture, and to conform with the relatively tight (center-to-center) dimensional spacings between connector slots on the VME bus. Signal connections between modules may be effected by cabling links between the modules and/or use one or more pins of module connectors for the second bus link portion of the VME bus, connection definitions for which would otherwise be unspecified for user customization.

Because VME-based communication system platforms can be expected to be employed in relatively harsh environments that expose the platforms to vibration, foreign matter and potentially damaging temperature variations, VME bus specifications mandate ruggedized housing architectures, that also cool the circuit components and effectively seal them from the external ambient. To accomplish these objectives it has been conventional practice to use very complex (and expensive) chassis-integrated heat transfer structures, on the one hand, and to use more thermally robust circuit components, per se, which undesirably add substantial bulk (and cost) to each circuit board, and thus to the overall housing assembly.

Advantageously, the printed circuit card support and cooling architecture described in the above-referenced '677 application, and diagrammatically illustrated in FIG. 1, is configured to remedy such shortcomings of conventional (VME) bus-mounted communication signal processing module configurations, by reducing the heat resistance paths to within a thermal parameter window that allows the use of commercial grade printed circuit card components. Moreover, its housing architecture has a smaller size than a conventional thermally controlled VME bus-based communication system architecture, so as to facilitate installation of a VME bus-based signal processing system configuration in a relatively limited volume hardware platform.

In particular, the housing structure of the '677 application has a generally regular rectangular, metallic chassis 10 formed of first and second parallel sidewalls 11 and 13, that adjoin parallel end walls 15 and 17, that are generally orthogonal to the sidewalls, and define therebetween a generally rectangular card-insertion cavity 21. The bottom of the chassis 10 is closed by a bottom cover 23, while the top is closed by a top cover 25.

The card insertion cavity 21 is bounded by a pair of slotted frames 27, which contain generally vertical, card-guide slots 29, that are sized to receive guide posts 31 mounted to opposite side edges 33 and 35 of respective printed circuit cards 40. At the bottom of the slotted frames 27 is a connector retention plate 37, supporting a parallel arrangement of spaced-apart, multi-pin electrical connectors 41. The multi-pin connectors receive associated dual in-line multi-pin connectors 43 attached to bottom edges 45 of the circuit cards 40, so that when installed in the chassis, the circuit cards are securely retained in mutually adjacent, spatially parallel relationship.

As shown in greater detail in the exploded views of FIGS. 2 and 3, and in the top view of FIG. 4 and the front view of FIG. 5, in order to cool a respective circuit card 40, a generally frame-configured, thermally conductive (e.g., metallic), convection-based heat exchanger 50 is mounted to one side 53 of the card, and functions to draw heat away from circuit components 42 on a second side 55 of the card. Affixing the heat exchanger 50 directly to the printed circuit card also increases the flexure stiffness of the card; mounting the circuit components 42 and heat exchanger 50 on opposite sides of the card 40 isolates the circuit components from the heat exchanger, preventing the circuit components from being exposed to any potentially corrosive foreign matter that may be present in the cooling fluid (typically external ambient air) flowing through the card's on-board heat exchanger.

The heat exchanger 50 has the general configuration of a frame 60 that a top wall 61, sidewalls 63 and 65, a bottom wall 67, and a back wall 68. These walls of a generally rectangular heat exchanger frame 60 form a cooling fluid flow chamber 70, containing adjacent, generally rectangular cooling fluid flow chamber sections 71 and 73, which are ported by cooling fluid inlet and exhaust ports 81 and 83 formed within the frame's top wall 61. The heat exchanger frame 60 also has a center wall 69, that extends from the top wall 61 to a location 75 spaced apart from the bottom wall 67, so as to form an intra chamber fluid communication port 85 connecting fluid flow chamber sections 71 and 73. A cover plate 80 is secured to the walls of the frame and thereby forms a front wall for the heat exchanger. The heat exchanger frame 60 and its adjoining cover plate 80 are sized to conform with the printed circuit card 40, so that when the cover plate 80 is surface-joined with the first side 53 of the circuit card 40, the entirety of the card surface area upon which the card's circuit components 42 are mounted is thermally coupled to the heat exchanger 50.

This direct face-to-face thermal coupling between the entirety of the first side 53 of the circuit card 40 with cover plate 80 reduces the length of the thermal resistance path between any circuit component 42 and the heat exchanger 50. It also causes the average temperature at any point on the printed circuit card 40 to be uniformly the same, resulting in the lowest possible component temperatures for any given material set and cooling fluid conditions. As a consequence, circuit components 42 mounted to the second side 55 of printed circuit card 40 need not be mil-spec; instead, commercial grade circuit elements, which are considerably less costly, may be used.

The circuit card's on-board heat exchanger 50 further includes first and second thermally conductive, fin-shaped corrugated heat exchanger elements 91 and 93 retained in respective chamber sections 71 and 73 of the cooling fluid flow chamber 70. These fin-shaped corrugated heat exchanger elements 91 and 93 are sized to substantially fill chambers 71 and 73, but leave a fluid circulation region 79 between bottom edges 92 and 94 of elements 91 and 93, respectively, and the bottom wall 67 of the frame 60. This fluid circulation region 79 serves as a return path for cooling fluid that has entered the chamber 71 via inlet port 81 and has traveled (downwardly, as shown at arrows 96) through heat exchanger element 91.

Upon exiting the bottom of heat exchanger element 91 in chamber 71, the cooling fluid then travels through the intra chamber fluid communication port 85 of region 79 and enters the bottom of heat exchanger element 93 in chamber 73. The cooling fluid then travels (upwardly as shown by arrows 98) through heat exchanger element 93 and exits chamber 73 through cooling fluid exhaust port 83. Advantageously, since each cooling fluid port 81 and 83 is located in a plane (top wall 61) that is parallel to the circuit card 40, the effective thickness of the integrated heat exchanger—printed circuit board architecture of the '677 application is such as to allow the circuit card to be readily inserted into any of the connectors 41 of the chassis 10.

In order to supply and remove cooling fluid via the ports 81 and 83, a cooling fluid supply/exhaust plenum 100 is mounted to a top portion 12 of the chassis 10. The plenum 100 includes a cooling fluid supply chamber 101 and a cooling fluid removal chamber 103 that are in fluid communication with the chambers 71 and 73 of the thermally conductive heat exchangers 50 of respective ones of printed circuit cards 40. The plenum 100 includes a generally rectangular frame 110 defined by a first sidewall 111, an end wall 113, a second sidewall 115, and a bottom wall 117, that generally enclose the pair of adjacent, generally rectangular chambers 101 and 103. Chamber 101 serves as a cooling fluid supply chamber and has a cooling fluid supply port 121 formed in a cover 120 that is attached to the top edges of the walls of frame 110. Complementarily, chamber 103 serves as a cooling fluid removal chamber and has a cooling fluid removal port 123 defined by a plenum opening 114 along a side portion 118 of the frame 110 coincident with an opening in the chassis 10.

The plenum frame 110 has a center wall 119 that extends from the first sidewall 111 to the second sidewall 115, so as to isolate the plenum chambers 101 and 103 from each other. Within the plenum chamber 101, the bottom wall 118 has a first set of generally elongated slots 131. Slots 131 are coincident with and adjoin the fluid inlet ports 81 of respective heat exchangers 50 of the circuit cards 40, when the cards are retained in their associated chassis guide slots. The floor portion of the plenum chamber 103 also has a second set of generally elongated slots 133, coincident with and adjoining the fluid exhaust ports 83 of the respective heat exchangers 50, when the cards are retained in their guide slots.

To seal the cooling fluid interfaces between slots 131 and 133 of plenum 100 and the fluid inlet and exhaust ports 81 and 83 of the heat exchangers 50, a multi-slotted gasket 140 is installed between the floor 118 of the plenum 100 and the top walls 61 of the heat exchanger frames 60. The gasket 140 has sets of generally elongated slots 141 and 143, that are coincident with and adjoin the elongated slots 131 and 133 of the plenum 110, and thereby the respective fluid inlet and exhaust ports 81 and 83 of the heat exchangers 50. What results is a cooling fluid path that is convectively coupled with each printed circuit card, yet is sealed off from their components, so that contaminants, which might be present in the cooling fluid (e.g., ambient air drawn in from the outside of the chassis), cannot come in contact with the circuit components of the printed circuit cards.

Now although the improved printed circuit card-mounted heat exchanger architecture described in the above-referenced '677 application is configured to convectively cool the components of the printed circuit cards using the outside ambient, while at the same time sealing the cooled components from the ambient medium, per se, there are circumstances where it is desired to employ standard VME circuit cards (which are cooled by thermally conducting paths interfacing the sides of the cards) in the same housing. Thus, there is a need for a housing configuration which will accommodate and cool both types of circuit cards—those that use less restrictive tolerance (e.g., non mil spec.) components, and those employing mil. spec. tolerance components.

SUMMARY OF THE INVENTION

In accordance with the present invention, this desire is successfully addressed by an efficient hardware modification of the housing and cooling architecture described in the above-referenced '677 application, that provides parallel cooling fluid travel paths for convective cooling of on-board heat exchangers of the non nil spec circuit cards, and for thermal conductive cooling of conventional (VME) circuit cards, while keeping both types of circuit cards protected from contaminants that may be present in the cooling fluid. For this purpose, like the housing and cooling architecture described in the above-referenced '677 application, the parallel cooling path housing structure of the present invention includes a chassis having a card-insertion cavity, into which on-board, convectively cooled printed circuit cards of the type described in the '677 application may be inserted and retained in mutually adjacent, spatially separated relationship.

However, rather than being ported to each of the card slots of the housing, the cooling fluid supply/exhaust plenum for the card-insertion cavity provides a first cooling fluid path that is ported to only a selected number of the card slots, in particular only those card slots for convectively cooled circuit cards of the type described in the '677 application. A multi-slotted gasket is inserted between the plenum floor and the cards' on-board heat exchangers, thereby sealing the cooling fluid interfaces between the plenum floor slots and the fluid inlet and exhaust ports of the cards' heat exchangers.

This ensures that the cooling fluid path for the convectively cooled cards is integrally thermally coupled with each such circuit card, yet is sealed off from the components mounted on the circuit cards, so that any potential contaminants in the cooling fluid cannot come in contact with either the convectively cooled printed circuit cards, or the remaining circuit cards at whose card positions no slots are provided in plenum floor. In order to cool the remaining circuit cards, the cooling fluid supply/exhaust plenum is configured to port cooling fluid entering the plenum along a second cooling fluid path through heat exchangers installed along sidewalls of the chassis, which are thermally conductively coupled to the sides of the cards.

DETAILED DESCRIPTION

Figure 1:
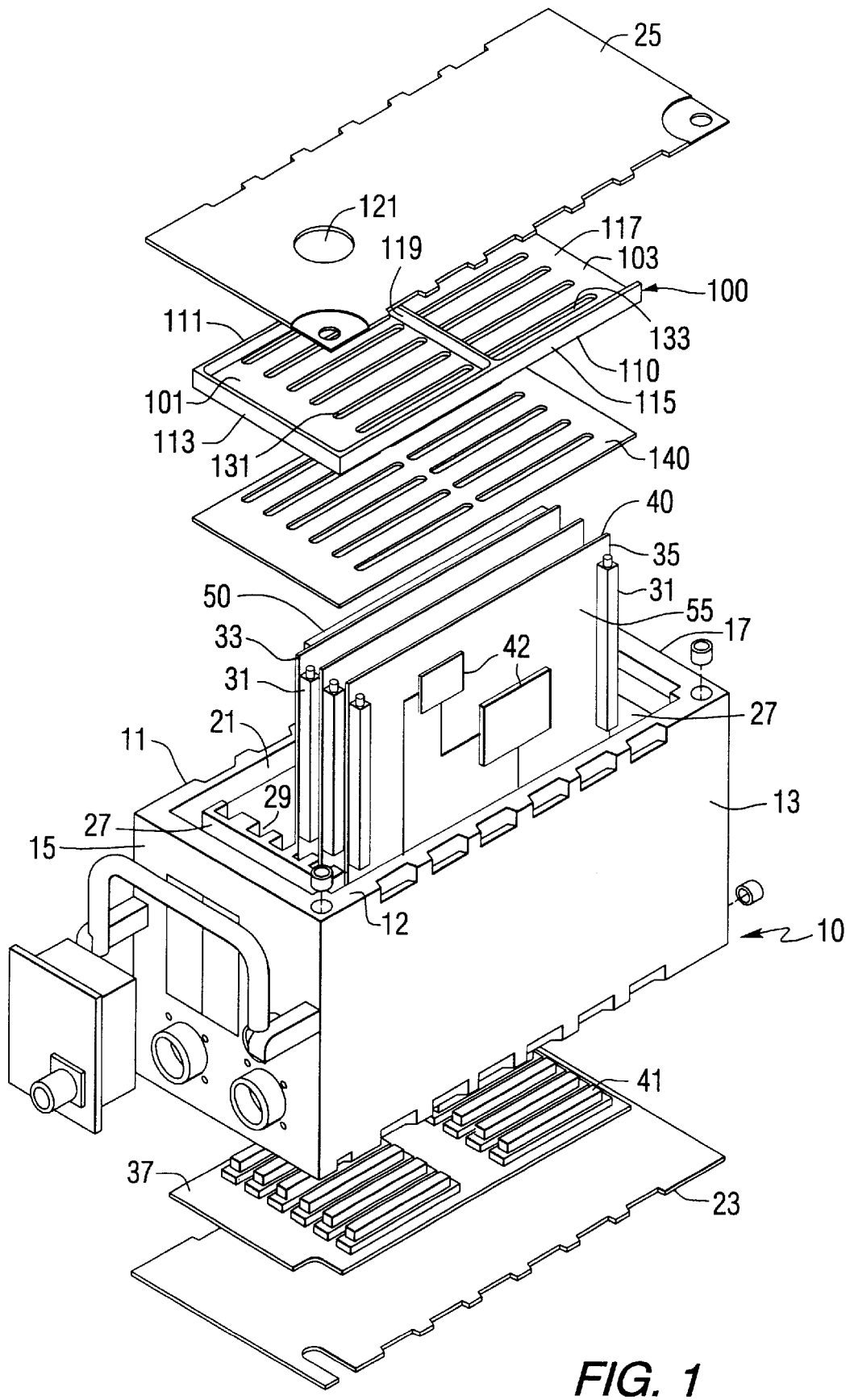
FIG. 1 is an exploded perspective view of a printed circuit card support and cooling structure described in the above-referenced '677 application.
Figure 2:
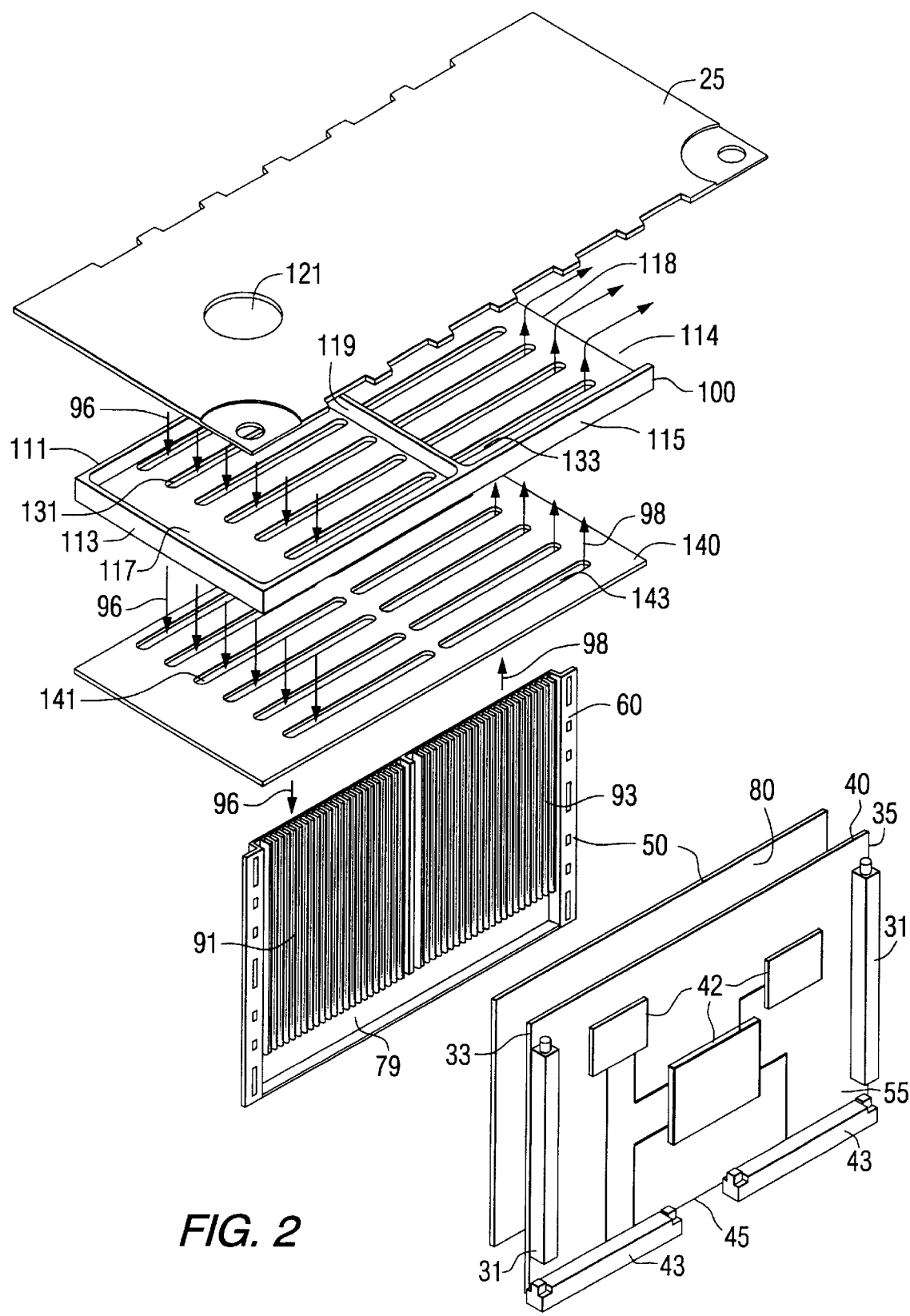
FIG. 2 is an exploded perspective view showing details of components of the structure of FIG. 1.

Like the housing structure of the '677 application, the dual cooling path, printed circuit card support and cooling architecture of the present invention, diagrammatically illustrated in FIGS. 6–11, comprises a generally regular rectangular, six-sided, ruggedized metallic chassis 210 having first and second parallel sidewalls 211 and 213, which adjoin a front panel/endwall 215 and an interior rear endwall 217, respectively, that are generally orthogonal to the chassis sidewalls, and define a generally rectangular printed circuit card-insertion cavity therebetween. The front panel/endwall 215 is fitted with various connectors and control elements, as shown.

The interior rear endwall 217 is spaced apart from a back cover 219, that also intersects sidewalls 211 and 213, forming the rear extremity of the housing and defining a cooling fluid supply space 218 between the interior rear endwall 217 and the housing's back cover 219. A pair of spaced apart vertical walls 222 and 224 are formed between and adjoin each of the interior rear endwall 217 and the housing's back cover 219, so as to subdivide the cooling fluid supply space 218 into three pockets, comprising a central, cooling fluid inlet pocket 226, and a pair of side supply pockets 228 and 229. The cooling fluid inlet pocket 226 is ported to the external ambient via an aperture 232 formed in a circular plate 233 that is mounted to and forms part of the back cover 219.

Figure 3:
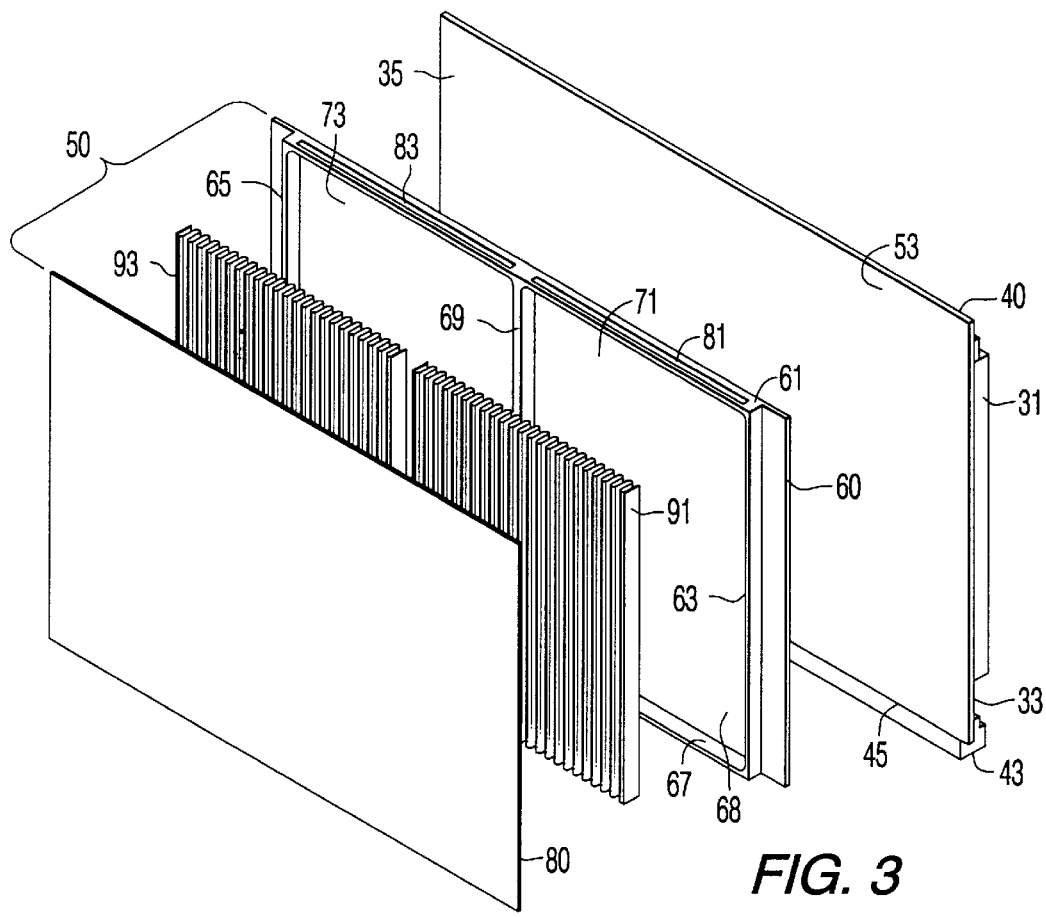
FIG. 3 is a reverse exploded perspective view of a printed circuit card and heat exchanger of FIGS. 1 and 2.
Figure 4:
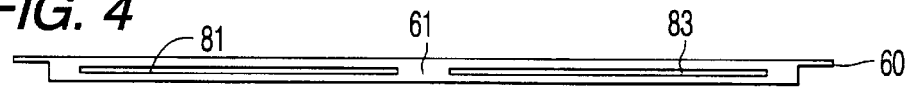
FIG. 4 is a top view of a heat exchanger frame.
Figure 5:
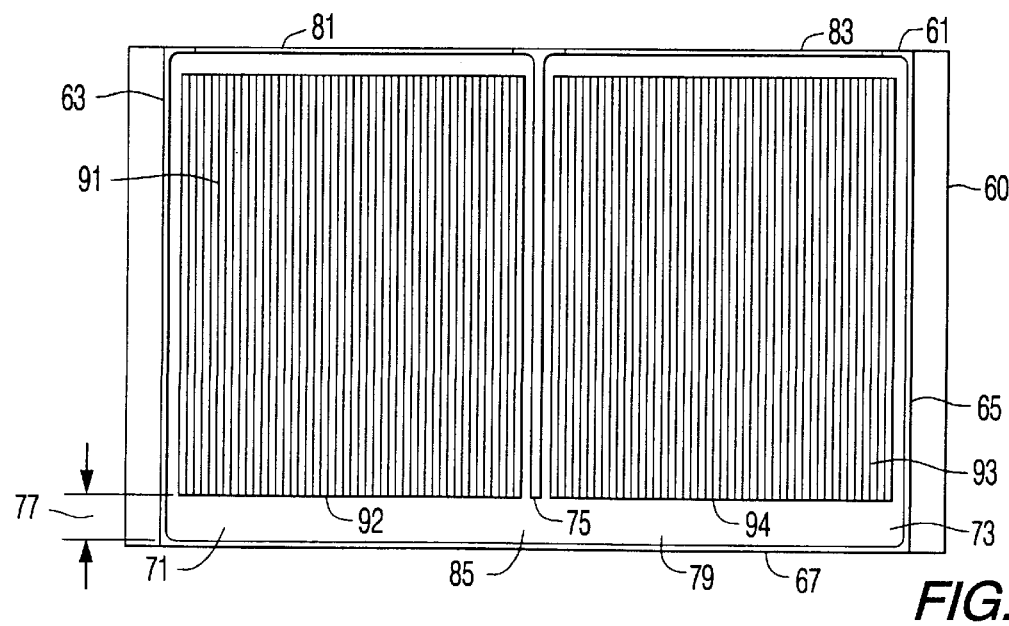
FIG. 5 is a front view of a heat exchanger frame, showing heat exchanger elements installed in cooling chambers of the frame.
Figure 6:
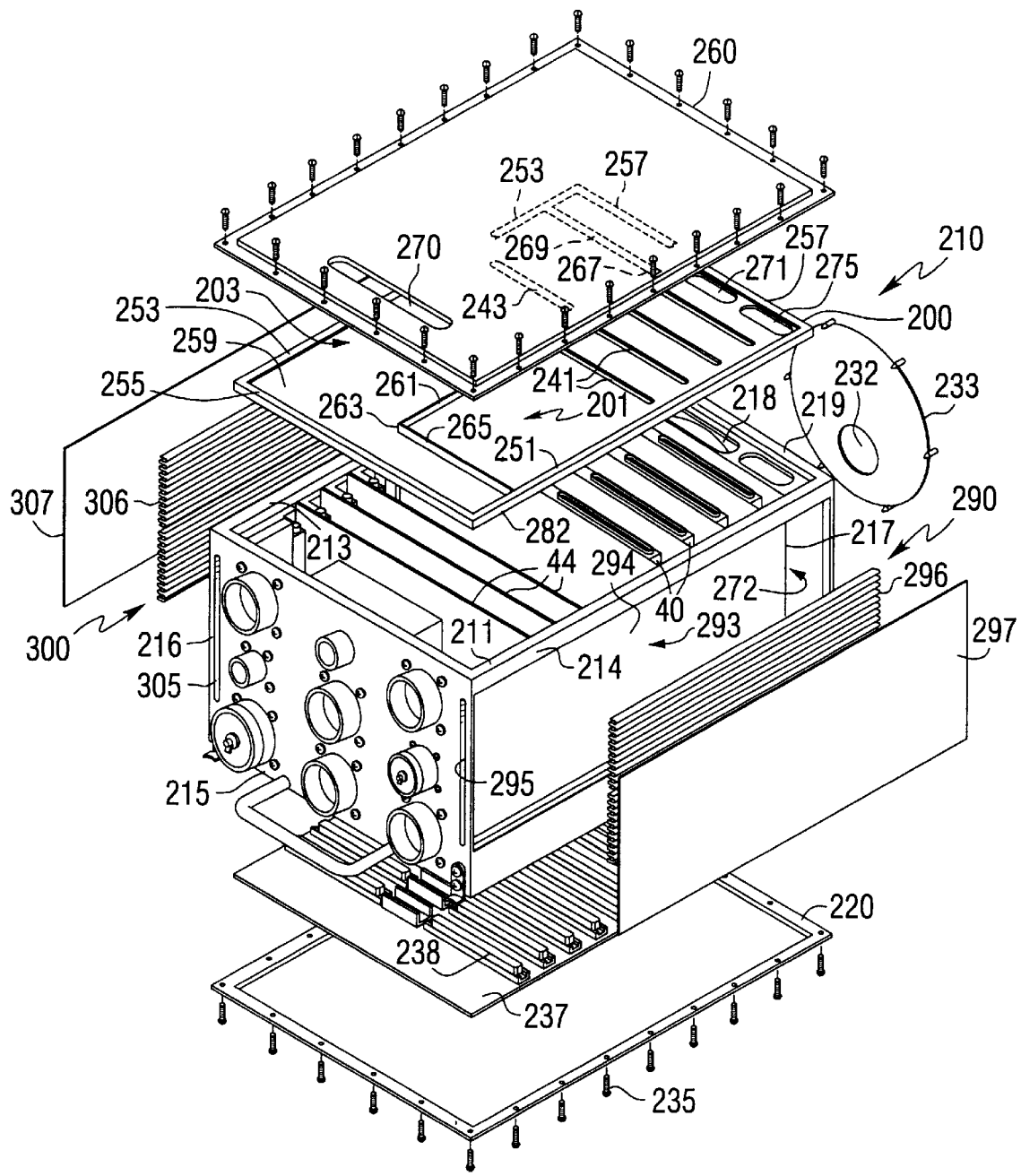
FIG. 6 is a front exploded perspective view of a dual cooling path, printed circuit card support and cooling structure in accordance with the present invention.
Figure 7:
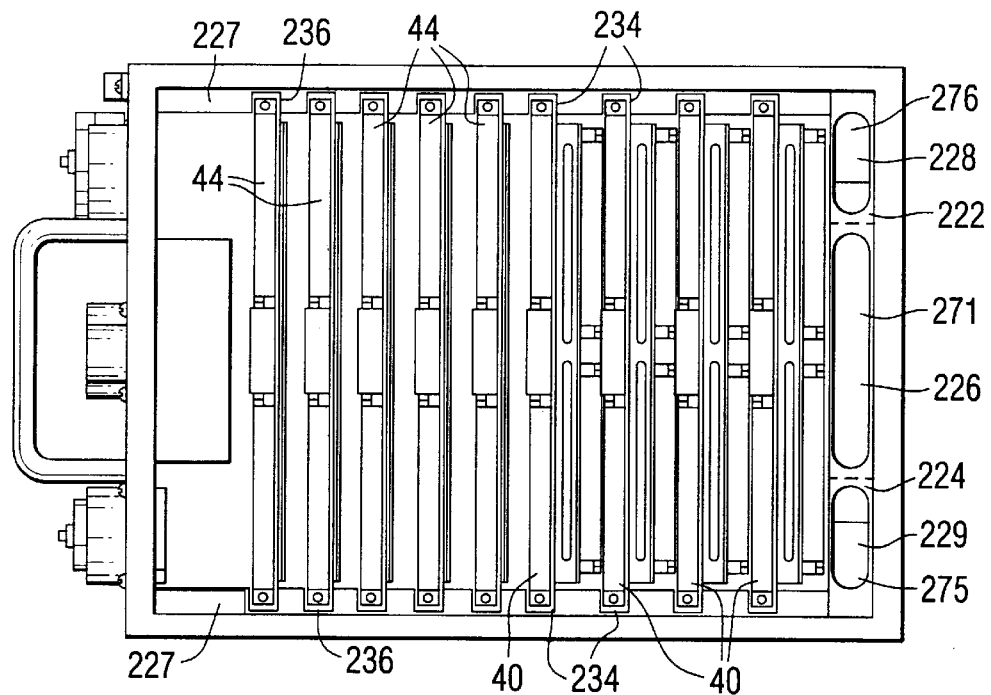
FIG. 7 is an open top view of dual cooling path, printed circuit card support and cooling structure of FIG. 6.
Figure 8:
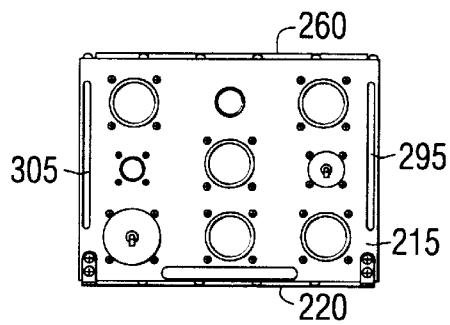
FIGS. 8, 9, 10 and 11 are respective front, rear, side and top views of the dual cooling path, printed circuit card support and cooling structure of FIGS. 6 and 7.
Figure 9:
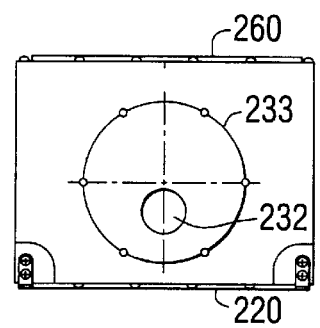
Figure 10:
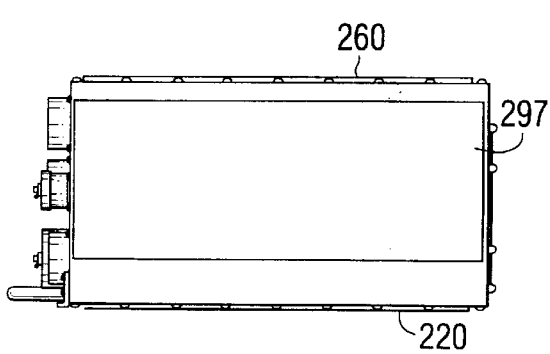
Figure 11:
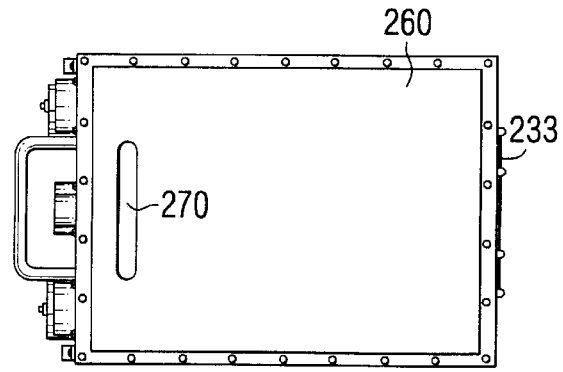

The card-insertion cavity is bounded by a pair of mutually opposite slotted frames 227, which contain a first set of generally vertical, card-guide slots 234, that are spaced and sized to receive the guide posts 31 on opposite side edges 33 and 35 of respective convective heat exchanger-containing printed circuit cards 40, configured as diagrammatically illustrated in FIG. 3–5, described above. Frames 227 additionally contain a second set of generally vertical, card-guide slots 236, that are spaced and sized to receive guide posts 32 on opposite side edges 34 and 36 of respective ones of conventionally configured, thermally conductively cooled printed circuit cards 44.

At the bottom of the slotted frames 227 is a connector retention plate 237, which supports a parallel arrangement of spaced-apart, multi-pin electrical connectors 238. These multi-pin connectors receive dual in-line multi-pin connectors, that are attached to the bottom edges of the circuit cards 40 and 44, so that, when installed in the chassis 210, both types of circuit cards are retained in their intended mutually adjacent, spaced-apart parallel relationship. A housing bottom cover 220 is secured (as be screws 235) to the bottom of the chassis 210 beneath connector retention plate 237.

In order to supply and remove cooling fluid to and from each of the on-board, convective heat exchangers 50 of the circuit cards 40, a cooling fluid supply and removal plenum 200 is installed immediately adjacent to a top portion of the chassis 210. The cooling fluid plenum 200 includes a cooling fluid injection chamber 201 and a cooling fluid removal chamber 203, that are ported via a plurality of elongated slots 241 and 243, respectively, to heat exchanger chambers 71 and 73 of each thermally conductive heat exchanger 50 of a respective convectively cooled printed circuit card 40.

The cooling fluid plenum 200 is configured as a generally rectangular frame defined by first and second sidewalls 251 and 253, first and second end walls 255 and 257, and a floor or bottom wall 259, that encompass the chambers 201 and 203. The geometries of the respective cooling fluid injection and removal chambers 201 and 203 of the cooling fluid plenum 200 are further defined by a center wall 261, a first end 263 of which terminates at a first interior endwall 265, that extends to the first sidewall 251. A second end 267 of the center wall 261 terminates at a second interior endwall 269, which extends to the second sidewall 253.

A cooling fluid inlet port 271 is formed in a first end region of the floor 259 between the first interior endwall 265 and endwall 257. First and second cooling fluid outlet ports 275 and 276 are formed in second and third respective end regions of the plenum floor 259, adjacent to opposite sides of the cooling fluid inlet port 271. The plenum's center wall 261 and connected interior end walls 265 and 269 isolate the cooling fluid inlet and removal chambers 201 and 203 of the plenum 200 from each other.

Within the cooling fluid inlet chamber 201, the first set of generally elongated slots 241 are coincident with and adjoin the fluid inlet ports 81 of respective on-board heat exchangers 50 of the convectively cooled circuit cards 40, when the cards 40 are retained in their associated chassis guide slots. Also, the second generally elongated slots 243 are coincident with and adjoin the fluid exhaust ports 83 of the respective heat exchangers 50 of the circuit cards 40 as retained in their respective guide slots.

A multi-slotted gasket 282 is inserted between the plenum floor 259 and the top walls 61 of the heat exchanger frames 60 of the heat exchangers 50, so as to seal the cooling fluid interfaces between slots 241 and 283 of the plenum chambers 201 and 203 and the fluid inlet and exhaust ports 81 and 83 of heat exchangers 50. This ensures that the convective cooling fluid path for the cards 40 is integrally thermally coupled with each printed circuit card 40, yet is sealed off from the components 42 mounted on the printed circuit cards 40, so that any potential contaminants, which might be present in the cooling fluid (ambient air drawn in from outside the chassis 210), cannot come in contact with either the convectively cooled printed circuit cards 40 or the thermally conductively cooled circuit cards 44, at whose card positions no slots are provided in the plenum floor.

A thermally conductive plenum cover 260, having a cooling fluid exhaust aperture 270 adjacent to the plenum endwall 255, is affixed to the top surface of the plenum 200, closing cooling fluid chambers 201 and 203 and the top of the housing. The first cooling fluid outlet port 275 of the plenum floor 259 is ported through a first sidewall aperture 272 at the side supply pocket 229, to a chamber 293 of a first sidewall heat exchanger 290, affixed to a first side 214 of the chassis 210. In a like manner, the second first cooling fluid outlet port 276 of the plenum floor 259 is ported through a second sidewall aperture at the side supply pocket 228, to a chamber of a second sidewall heat exchanger 300 affixed to a second side 216 of the chassis 210.

Chamber 293 of the first sidewall heat exchanger 290 has an elongated slot-configured cooling fluid exhaust port 295 formed in front endwall/panel 215 of the chassis 210. A thermally conductive, fin-shaped, generally elongated corrugated heat exchanger element 296 is installed in chamber 293, so as to be in intimate thermal contact with the thermally conductive sidewall surface 294 of sidewall chamber 293. In like manner, chamber 303 of the second sidewall heat exchanger 300 has an elongated slot-configured cooling fluid exhaust port 305 formed in the chassis' front endwall 215. Also, a thermally conductive, fin-shaped, generally elongated corrugated heat exchanger element 306 is installed in the chassis' opposite sidewall chamber, so as to be in intimate thermal contact with the thermally conductive sidewall surface of that sidewall chamber. The respective sidewall chambers of the chassis 210 are closed by chassis sidewall covers 297 and 307.

In operation, cooling fluid (external ambient air) enters the cooling fluid inlet pocket 226 through the aperture 232 in the chassis' back cover 219, and travels upwardly through cooling fluid inlet port 271 in the cooling fluid plenum floor 259. A first portion of the air passing through the cooling fluid inlet port 271 travels along a first convective path into the cooling fluid inlet chamber 201, while a second portion of the air travels along a second path for the conductively cooled cards 44, to the first and second cooling fluid outlet ports 275 and 276.

The air traveling along the first cooling fluid trave path and entering the plenum's cooling fluid inlet chamber 201 then travels into the first set of generally elongated slots 281 in the plenum's floor 259 and into the fluid inlet ports 81 of respective on-board heat convective exchangers 50 of the convectively cooled circuit cards 40. Cooling fluid that has circulated through the cards' convective heat exchangers 50 is returned upwardly through the slots 283 of the fluid removal chamber 203, and exits the plenum 200 through the cooling fluid exhaust aperture 270 in the plenum cover 268.

As noted earlier, the slots 281 and 283 in the plenum floor 259 overlie only those card slots where convectively cooled circuit cards 40, having on-board, convective heat exchangers 50, are installed. Moreover these slots are sealed by means of the multi-slotted gasket 282 inserted between the plenum floor 259 and the top walls 61 of the heat exchanger frames 60 of the heat exchangers 50. Thus, the convective cooling fluid path for the circuit cards 40 is integrally thermally coupled with each printed circuit card 40, per se, yet physically sealed off from the components 42 mounted on the printed circuit cards 40. This prevents any potential contaminants in the cooling fluid (ambient air drawn in from outside the chassis 210) from coming in contact with either the convectively cooled printed circuit cards 40, or the thermally conductively cooled circuit cards 44 (at whose card positions no slots are provided in the plenum floor 259).

The air traveling along the second cooling fluid travel path and entering the first and second cooling fluid outlet ports 275 and 276 passes through side supply pockets 228 and 229 and is ported through sidewall apertures 272 and 274 to respective sidewall heat exchangers 290 and 300. The cooling air then passes through the heat exchanger elements 296 and 396 installed in the respective sidewall chambers of the chassis, removing heat thermally transferred thereto through the chassis sidewalls from the circuit cards 44, and exits the housing through the exhaust ports 295 and 305 at the sides of the front panel 215. Since the entirety of the card insertion cavity (for both cards 40 and 44) is sealed from the second path cooling air, any contaminants in the second path cooling fluid cannot come in contact with either type of card installed in the card insertion cavity.

As will be appreciated from the foregoing description, through an efficient hardware modification of the housing and cooling architecture described in the above-referenced '677 application, the present invention provides a dual card type support and cooling enclosure, having parallel cooling fluid travel paths emanating from a single cooling fluid inlet port, that affords convective cooling of both printed circuit cards employing on-board heat exchangers, and thermal conductive cooling of conventional (VME) circuit cards, that are installable in the same (VME) bus.

While we have shown and described an embodiment in accordance with the present invention, it is to be understood that the same is not limited thereto but is susceptible to numerous changes and modifications as are known to a person skilled in the art, and we therefore do not wish to be limited to the details shown and described herein, but intend to cover all such changes and modifications as are obvious to one of ordinary skill in the art.

What is claimed:

1. A method of securely retaining and cooling within a sealed housing enclosure both convectively cooled printed circuit cards and conductively cooled printed circuit cards, said method comprising the steps of:

(a) providing a chassis having a sealed card-insertion cavity between parallel sidewalls thereof, containing a plurality of card-guide slots that are configured to receive and guide said convectively cooled printed circuit cards and said conductively cooled printed circuit cards into electrical connectors arranged parallel with one another at a first portion of said chassis;

(b) mounting thermally conductive sidewall heat exchangers at sidewalls of said chassis and over which cooling fluid passes, said thermally conductive sidewall heat exchangers being thermally conductively coupled to said conductively cooled printed circuit cards through sidewalls of said chassis so as to thermally remove heat therefrom through said chassis sidewalls;

(c) providing a cooling fluid supply/exhaust plenum at a second portion of said chassis, that is spaced apart from said first portion of said chassis and sealing said card-insertion cavity therebetween, said cooling fluid supply/exhaust plenum including a cooling fluid supply chamber having a plurality of cooling fluid supply apertures overlying card slots of only said convectively cooled printed circuit cards, and a cooling fluid exhaust chamber adjacent to said cooling fluid supply chamber and from which said cooling fluid having cooled circuit components of said convectively cooled printed circuit cards is removed, said cooling fluid exhaust chamber having a plurality of cooling fluid removal apertures adjacent to said plurality of cooling fluid supply apertures;

(d) attaching a plurality of thermally conductive heat exchangers to first sides said convectively cooled printed circuit cards, such that a respective thermally conductive heat exchanger is attached to and in thermally conductive engagement with a first side of a respective convectively cooled printed circuit card, and is operative to draw heat away from and thereby cool said circuit components that are mounted to a second side of said respective convectively cooled printed circuit card, said respective thermally conductive heat exchanger including a cooling fluid inlet port joined in sealing engagement with a respective cooling fluid supply aperture of said plurality of cooling supply apertures of said cooling fluid supply chamber of said cooling fluid supply/exhaust plenum, and through which said cooling fluid is introduced from said cooling fluid supply/exhaust plenum, and a cooling fluid outlet port adjacent to said cooling fluid inlet port and joined in sealing engagement with a respective cooling fluid removal aperture of said plurality of cooling fluid removal apertures of said cooling fluid exhaust chamber of said cooling fluid supply/exhaust plenum, and through which said cooling fluid is exhausted from said heat exchanger into said cooling fluid supply/exhaust plenum;

(e) installing said convectively cooled printed circuit cards and said conductively cooled printed circuit cards into said arrangement of electrical connectors, so that said convectively cooled printed circuit cards and said conductively cooled printed circuit cards are retained thereby in mutually adjacent, spatially parallel relationship with one another; and (f) supplying cooling fluid to said cooling fluid supply chamber so that said cooling fluid flows through said plurality of cooling fluid supply apertures overlying card slots of only said convectively cooled printed circuit cards, through said plurality of thermally conductive heat exchangers attached to said first sides said convectively cooled printed cards and exits by way of said plurality of cooling fluid removal apertures of said cooling fluid exhaust chamber.

2. A method according to claim 1, wherein said conductively cooled printed circuit cards comprise VME circuit cards, and wherein step (b) comprises interfacing said VME circuit cards by way of thermally conducting paths to said thermally conductive sidewall heat exchangers mounted at said sidewalls of said chassis, and wherein said convectively cooled printed circuit cards contain commercial grade printed circuit card components having tolerance restrictions less than printed circuit card components of said VME circuit cards.

3. A method according to claim 1, wherein said respective thermally conductive heat exchanger further includes a frame having a first end wall adjoining said fluid supply/exhaust plenum and containing said cooling fluid inlet port and said cooling fluid outlet port, sidewalls parallel with side edges of said convectively cooled printed circuit cards, a second end wall opposite to said first end wall, and a back wall, that enclose first and second adjacent cooling fluid flow chambers, and a further wall that extends from said first end wall to a location spaced apart from said second end wall, so as to provide an intra chamber fluid communication port connecting said first and second cooling fluid flow chambers, and a heat exchanger cover plate, and wherein said heat exchanger further includes first and second thermally conductive heat exchange elements, respectively retained in and substantially filling said first and second cooling fluid flow chambers, but leaving a fluid circulation region therein that provides a fluid flow loop path for cooling fluid that has entered said first chamber via said cooling fluid inlet port in said first end wall of said frame, and has traveled through said first heat exchange element and, upon exiting said first heat exchange element, travels through said fluid circulation region and said second heat exchange element in said second chamber, exiting through said cooling fluid exhaust port in said first end wall of said frame.

4. A method according to claim 1, wherein step (c) further includes providing gasket material that forms a sealed interface between said cooling fluid supply and removal slots of said supply/exhaust plenum and said cooling fluid inlet and exhaust ports, respectively, of said thermally conductive heat exchangers.

5. A method according to claim 4, wherein said gasket material comprises a multi-apertured gasket inserted between said supply/exhaust plenum and said first end wall of said heat exchanger.

6. A method according to claim 1, wherein step (a) includes configuring said chassis with a cooling fluid inlet that is ported to external ambient and is configured to supply cooling fluid to said cooling fluid supply/exhaust plenum.

7. A method according to claim 6, wherein said sidewalls of said chassis include respective chambers that are ported to said cooling fluid supply/exhaust plenum at a first portion of said chassis adjacent to a first end of said sidewalls of said chassis, and are ported to external ambient at a second portion of said chassis adjacent to a second end of said sidewalls of said chassis, said respective chambers containing thermally conductive heat exchanger elements that are thermally conductively coupled through said chassis sidewalls to said conductively cooled printed circuit cards and over which cooling fluid passes as it travels through said chambers.

8. A method of securely retaining and cooling first and second, respectively diverse types of printed circuit cards in a housing comprising the steps of:

(a) providing a chassis having a card-insertion cavity between sidewalls thereof, and containing a plurality of card slots having electrical connectors at a first portion of said chassis that retain said first and second, respectively diverse types of printed circuit cards in mutually adjacent, spatially parallel relationship with one another;

(b) providing a cooling fluid supply/exhaust plenum for said first type of printed circuit boards at a second portion of said chassis spaced apart from said first portion of said chassis and sealing said card-insertion cavity therebetween, said cooling fluid supply/exhaust plenum including a cooling fluid supply chamber, to which cooling fluid for convectively cooling circuit components of said first type of printed circuit cards is supplied, said cooling fluid supply chamber having a plurality of cooling fluid supply apertures overlying card slots of only said first type of printed circuit cards, and a cooling fluid exhaust chamber adjacent to said cooling fluid supply chamber and from which said cooling fluid having cooled circuit components of said first type of printed circuit cards is removed, said cooling fluid exhaust chamber having a plurality of cooling fluid removal apertures adjacent to said plurality of cooling fluid supply apertures;

(c) attaching a plurality of thermally conductive heat exchangers to said first type of printed circuit cards, such that a respective thermally conductive heat exchanger is attached to and in thermally conductive engagement with a first side of a respective first type of printed circuit card, so as to draw heat away from and thereby cool said circuit components mounted to a second side of said respective first type of printed circuit card, and wherein said respective thermally conductive heat exchanger includes a cooling fluid inlet port joined in sealing engagement with a respective cooling fluid supply aperture of said plurality of cooling supply apertures of said cooling fluid supply chamber of said cooling fluid supply/exhaust plenum, and through which said cooling fluid is introduced from said cooling fluid supply/exhaust plenum, and a cooling fluid outlet port adjacent to said cooling fluid inlet port and joined in sealing engagement with a respective cooling fluid removal aperture of said plurality of cooling fluid removal apertures of said cooling fluid exhaust chamber of said cooling fluid supply/exhaust plenum, and through which said cooling fluid is exhausted from said heat exchanger into said cooling fluid supply/exhaust plenum;

(d) mounting thermally conductive sidewall heat exchangers for cooling said second type of printed circuit cards and being mounted at sidewalls of said chassis and over which cooling fluid passes, said thermally conductive sidewall heat exchangers being thermally conductively coupled to said second type of printed circuit cards through sidewalls of said chassis so as to thermally conductively remove heat therefrom through said chassis sidewalls; and (e) supplying cooling fluid to said cooling fluid supply chamber, so that said cooling fluid circulates through heat exchangers of said first type of printed circuit cards, and is removed therefrom by way of said cooling fluid exhaust chamber.

9. A method according to claim 8, wherein said first type of printed circuit cards contain commercial grade printed circuit card components having tolerance restrictions less than printed circuit card components of VME circuit cards, and wherein said conductively cooled printed circuit cards comprise VME circuit cards, which are cooled by thermally conducting paths interfacing sides thereof with said thermally conductive sidewall heat exchangers mounted at said sidewalls of said chassis.

10. A method according to claim 8, wherein said respective thermally conductive heat exchanger further includes a frame having a first end wall adjoining said fluid supply/exhaust plenum and containing said cooling fluid inlet port and said cooling fluid outlet port, sidewalls parallel with side edges of said first type of printed circuit cards, a second end wall opposite to said first end wall, and a back wall, that enclose first and second adjacent cooling fluid flow chambers, and a further wall that extends from said first end wall to a location spaced apart from said second end wall, so as to provide an intra chamber fluid communication port connecting said first and second cooling fluid flow chambers, and a heat exchanger cover plate, and wherein said heat exchanger further includes first and second thermally conductive heat exchange elements, respectively retained in and substantially filling said first and second cooling fluid flow chambers, but leaving a fluid circulation region therein that provides a fluid flow loop path for cooling fluid that has entered said first chamber via said cooling fluid inlet port in said first end wall of said frame, and has traveled through said first heat exchange element and, upon exiting said first heat exchange element, travels through said fluid circulation region and said second heat exchange element in said second chamber, exiting through said cooling fluid exhaust port in said first end wall of said frame.

11. A method according to claim 8, wherein step (b) comprises providing gasket material that forms a sealed interface between said cooling fluid supply and removal slots of said supply/exhaust plenum and said cooling fluid inlet and exhaust ports, respectively, of said thermally conductive heat exchangers.

12. A method according to claim 11, wherein step (b) comprises inserting a multi-apertured gasket inserted between said supply/exhaust plenum and said first end wall of said heat exchanger.

13. A method according to claim 8, wherein step (a) comprises providing said chassis with a cooling fluid inlet that is ported to external ambient and through which cooling fluid is supplied to said cooling fluid supply/exhaust plenum.

14. A method according to claim 13, wherein said sidewalls of said chassis include respective chambers that are ported to said cooling fluid supply/exhaust plenum at a first portion of said chassis adjacent to a first end of said sidewalls of said chassis, and are ported to external ambient at a second portion of said chassis adjacent to a second end of said sidewalls of said chassis, said respective chambers containing thermally conductive heat exchanger elements that are thermally conductively coupled through said chassis sidewalls to said second type of printed circuit cards and over which cooling fluid passes as it travels through said chambers.

* * * * *